(12) United States Patent
Iguchi et al.

(10) Patent No.: US 6,599,682 B2
(45) Date of Patent: Jul. 29, 2003

(54) METHOD FOR FORMING A FINELY PATTERNED PHOTORESIST LAYER

(75) Inventors: Etsuko Iguchi, Machida (JP); Kazumasa Wakiya, Chigasaki (JP)

(73) Assignee: Tokyo Ohka Kogyo Co., Ltd., Kanagawa-ken (JP)

(*) Notice: Subject to any disclaimer, the term of this patent is extended or adjusted under 35 U.S.C. 154(b) by 124 days.

(21) Appl. No.: 09/839,200

(22) Filed: Apr. 23, 2001

(65) Prior Publication Data

US 2001/0044080 A1 Nov. 22, 2001

(30) Foreign Application Priority Data

Apr. 26, 2000 (JP) ......................................... 2000-126527

(51) Int. Cl.[7] .................................................. G03F 7/00
(52) U.S. Cl. ........................ 430/322; 430/311; 430/313; 430/290; 430/950
(58) Field of Search ................................ 430/311, 313, 430/322, 290, 950

(56) References Cited

U.S. PATENT DOCUMENTS

| | | | | |
|---|---|---|---|---|
| 5,472,829 A | * | 12/1995 | Ogawa | 430/325 |
| 5,607,824 A | | 3/1997 | Fahey et al. | 430/510 |
| 5,830,623 A | * | 11/1998 | Maruyama et al. | 430/322 |
| 5,891,959 A | * | 4/1999 | Kunz | 525/107 |
| 6,042,992 A | * | 3/2000 | Dammel et al. | 430/329 |
| 6,348,404 B1 | * | 2/2002 | Tabara et al. | 438/636 |
| 2001/0044080 A1 | * | 11/2001 | Iguchi et al. | 430/322 |

FOREIGN PATENT DOCUMENTS

| | | |
|---|---|---|
| JP | 5-299338 | 11/1993 |
| JP | 6-196400 | 7/1994 |
| JP | 7-201708 | 8/1995 |
| JP | 7-201716 | 8/1995 |
| JP | 7-201825 | 8/1995 |
| JP | 7-312336 | 11/1995 |
| JP | 8-17711 | 1/1996 |
| JP | 8-37140 | 2/1996 |
| JP | 8-51072 | 2/1996 |
| JP | 8-55790 | 2/1996 |
| JP | 11-8248 | 1/1999 |

* cited by examiner

Primary Examiner—Mark F. Huff
Assistant Examiner—Nicole Barreca
(74) Attorney, Agent, or Firm—Wenderoth, Lind & Ponack, L.L.P.

(57) ABSTRACT

The invention discloses an improvement in the photolithographic patterning method of a photoresist layer formed on a substrate surface with intervention of an anti-reflection coating film, in which the refractive index and the light-absorption coefficient of the anti-reflection coating film are controlled in such a way that, in a graph prepared by plotting the thickness of the anti-reflection coating film taken as the abscissa values and the reflectivity of the light for patterning exposure at the interface between the anti-reflection coating film and the photoresist layer thereon taken as the ordinate values, the range of the variation in the film thickness corresponding to an increment of 0.01 in the reflectivity in the vicinity of the minimum point on the thickness vs. reflectivity curve does not exceed ±0.01 μm.

5 Claims, 3 Drawing Sheets

METHOD FOR FORMING A FINELY PATTERNED PHOTORESIST LAYER

BACKGROUND OF THE INVENTION

The present invention relates to a novel method for the formation of a finely patterned photoresist layer on a substrate surface. More particularly, the invention relates to an improvement in a method for finely patterning a photoresist layer formed on a substrate surface with intervention of a film of an organic anti-reflection agent therebetween in a patterning process involving the steps of patternwise exposure of the photoresist layer to actinic rays and development of the patternwise exposed photoresist layer.

Along with the trend in recent years in the technology of semiconductor devices such as ICs and LSIs and liquid crystal display panels which are imparted with more and more increased fineness and a multilayered structure, a difficult problem to be solved in the photolithographic patterning of a photoresist layer is caused by the standing waves due to the exposure light which adversely influence on the quality of patterning. As is widely practiced in the photolithographic technology, this problem due to standing waves can be solved at least partly by interposing a film of an organic anti-reflection agent between the substrate surface and the photoresist layer thereon. It is noted that the thickness of the intermediate anti-reflection film is desired to be decreased smaller and smaller in order to be in compliance with the trend of the photoresist layer toward a smaller and smaller thickness.

An anti-reflection film for such a purpose can be formed on the substrate surface by several different methods including a method disclosed in Japanese Patent Kokai 11-8248 in which a thin carbon film is formed on the substrate surface by vapor deposition and a method disclosed in Japanese Patent Kokai 8-37140 according to which the optical properties of an organic anti-reflection film can be controlled by conducting formation of the organic anti-reflection film under irradiation with ultraviolet light. These prior art methods, however, do not provide a full solution to the problem due to the standing waves, especially, when the thickness of the anti-reflection film is so small as is mentioned above.

SUMMARY OF THE INVENTION

The present invention accordingly has an object to provide a photolithographic method for finely patterning a photoresist layer formed on a substrate surface with intervention of an organic anti-reflection film without being affected by the standing waves of the exposure light even when the thickness of the anti-reflection film is very small. It is a very unique and unexpected discovery that this object of the invention can well be accomplished when the anti-reflection film has a specifically controlled refractive index (n) and absorption coefficient (k) to the patterning exposure light by appropriately selecting the types of the anti-reflection compositions and the contents of the components therein.

Thus, the present invention provides an improvement, in the photolithographic patterning process for patterning of a photoresist layer comprising the steps of: forming an anti-reflection coating film of an organic anti-reflection agent comprising a resinous compound, a highly light-absorbing compound and a thermally crosslinkable compound on the surface of a substrate; forming a photoresist layer on the organic anti-reflection film; patternwise exposing the photoresist layer to light; and subjecting the thus patternwise exposed photoresist layer to a development treatment, which comprises controlling the refractive index and absorption coefficient of the anti-reflection coating film in such a way that, in the curve of a graph plotted for the thickness of the anti-reflection coating film taken as the abscissa values and the reflectivity to the exposure light at the interface between the anti-reflection coating film and the photoresist layer taken as the ordinate values, the range of the abscissa value of the thickness of the anti-reflection coating film corresponding to an increment of 0.01 in the ordinate value of the reflectivity on both sides of the minimum point on the curve does not exceed ±0.01 $\mu$m.

Preferably, the above-mentioned reflectivity at the interface on the minimum point of the curve should not exceed 0.01. In particular, control of the refractive index and absorption coefficient of the anti-reflection coating film are accomplished by selecting the types and contents of the resinous ingredients contained in the anti-reflection coating composition, by selecting the types and contents of the highly light-absorbing compound contained therein and/or by selecting the types and contents of the thermally crosslinkable compound contained therein.

DETAILED DESCRIPTION OF THE PREFERRED EMBODIMENTS

Figure 1:
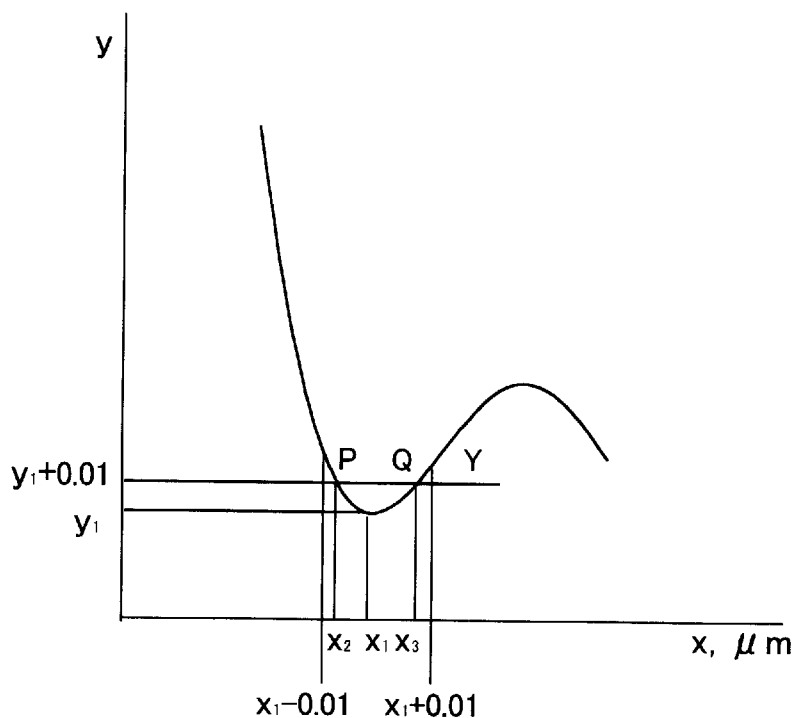
FIG. 1 is an explanatory illustration of the graph showing a curve plotted for the thickness of the anti-reflection coating film (abscissa) and the interface reflectivity (ordinate).

The principle of the improvement accomplished by the present invention is explained by making reference to FIG. 1 which is an explanatory illustration of a graph plotted for the thickness x of the anti-reflection coating film as the abscissa and the interfacial reflectivity y to the exposure light as the ordinate.

In FIG. 1, the x-y curve has a minimum point at x=$x_1$ where y has a value of $y_1$. The intersections P, Q between the horizontal line Y with y=$y_1$+0.01 each have an x value of $x_2$ and $x_3$, respectively. It is the requirement of the present invention that the differences of $x_1$-$x_2$ and $x_3$-$x_1$ each do not exceed 0.01. This unique requirement can be satisfied by controlling the refractive index n and the light-absorption coefficient k of the organic anti-reflection film.

The substrate and the photoresist composition to which the inventive method is applicable are not particularly limitative and any known ones conventionally employed in the photolithographic patterning works can also be employed here. For example, semiconductor silicon wafers can be used as the substrate and any of negative-working and positive-working photoresist compositions can be used provided that the photoresist layer thereof can be developed by using an aqueous alkaline developer solution.

Examples of suitable photoresist compositions include those positive-working photoresist compositions containing a naphthoquinone diazide compound and a novolak resin, positive-working chemical-amplification photoresist compositions containing a radiation-sensitive acid-generating compound, a compound capable of being imparted with an increased solubility in an aqueous alkaline solution when decomposed by interaction with an acid and negative-working chemical-amplification photoresist compositions containing a radiation-sensitive acid-generating compound, a crosslinking agent and an alkali-soluble resin, though not particularly limitative thereto.

The organic anti-reflection coating agent from which the intermediate anti-reflection coating film is formed is also not particularly limitative and any conventional ones can be used here if the above-mentioned requirements can be satisfied. The examples of suitable organic anti-reflection agents include those containing a highly light-absorbing compound and a crosslinking agent, those containing a highly light-absorbing compound and a binder resin and those containing a highly light-absorbing compound, a crosslinking agent and a binder resin in combination.

The above mentioned highly light-absorbing compound as the essential ingredient in the organic anti-reflection agent can be selected from benzophenone compounds, diphenyl sulfone compounds, diphenyl sulfoxide compounds, naphthalene compounds and anthracene compounds, which are used each conventionally as an ultraviolet-absorbing agent. These highly light-absorbing compounds can be used either singly or as a combination of two kinds or more according to need.

Examples of the benzophenone compounds include 2,2',4,4'-tetrahydroxybenzophenone, 2-hydroxy-4'-dimethylaminobenzophenone, 2,4-dihydroxy-4'-dimethylaminobenzophenone, 2,4-dihydroxy-4'-diethylaminobenzophenone, 4,4'-bis(diethylamino)benzophenone, 4,4'-bis(dimethylamino)benzophenone and the like.

Examples of the diphenyl sulfone compounds include bis(2,4-dihydroxyphenyl) sulfone, bis(3,4-dihydroxyphenyl) sulfone, bis(3,5-dihydroxyphenyl) sulfone, bis(3,6-dihydroxyphenyl) sulfone, bis(4-hydroxyphenyl) sulfone, bis(3-hydroxyphenyl) sulfone, bis(3,5-dimethyl-4-hydroxyphenyl) sulfone and the like.

Examples of the diphenyl sulfoxide compounds include bis(2,3-dihydroxyphenyl) sulfoxide, bis(5-chloro-2,3-dihydroxyphenyl) sulfoxide, bis(2,4-dihydroxyphenyl) sulfoxide, bis(2,4-dihydroxy-6-methylphenyl) sulfoxide, bis(5-chloro-2,4-dihydroxyphenyl) sulfoxide, bis(2,5-dihydroxyphenyl) sulfoxide, bis(3,4-dihydroxyphenyl) sulfoxide, bis(3,5-dihydroxyphenyl) sulfoxide, bis(2,3,4-trihydroxyphenyl) sulfoxide, bis(2,3,4-trihydroxy-6-methylphenyl) sulfoxide, bis(5-chloro-2,3,4-trihydroxyphenyl) sulfoxide, bis(2,4,6-trihydroxyphenyl) sulfoxide, bis(5-chloro-2,4,6-trihydroxyphenyl) sulfoxide and the like.

Examples of the naphthalene compounds include 1-naphthol, 2-naphthol, naphthalenediol, naphthalenetriol, 1-naphthalene methanol, 2-naphthalene methanol, 1-(2-naphthyl)ethanol, naphthalenecarboxylic acid, 1-naphthol-4-carboxylic acid, 1,8-naphthalenedicarboxylic acid, naphthol sulfonic acid and the like.

Examples of the anthracene compounds include 1-hydroxyanthracene, 9-hydroxyanthracene, 1,2-dihydroxyanthracene, 1,5-dihydroxyanthracene, 9,10-dihydroxyanthracene, 1,2,3-trihydroxyanthracene, 1,2,3,4-tetrahydroxyanthracene, 1,2,3,4,5,6-hexahydroxyanthracene, 1,2,3,4,5,6,7,8-octahydroxyanthracene, 1-hydroxymethylanthracene, 9-hydroxymethylanthracene, 9-hydroxyethylanthracene, 9-hydroxyhexylanthracene, 9-hydroxyoctylanthracene, 9,10-dihydroxymethylanthracene, 9-anthracenecarboxylic acid, 9,10-anthracenedicarboxylic acid, glycidylanthracenecarboxylic acid, condensation products between glycidylanthracenyl methyl alcohol or anthracenyl methyl alcohol and a polycarboxylic acid such as, for example, oxalic acid, malonic acid, methylmalonic acid, ethylmalonic acid, dimethylmalonic acid, succinic acid, methylsuccinic acid, 2,2-dimethylsuccinic acid, glutaric acid, adipic acid and pimelic acid, and the like.

The crosslinking agent is a compound having functional groups capable of thermally forming crosslinks between the molecules of the compound per se or with the molecules of the highly light-absorbing compound and/or the binder resin as exemplified by nitrogen-containing organic compounds having, in a molecule, at least two amino groups substituted by hydroxyalkyl and/or alkoxyalkyl groups. Examples of suitable crosslinking agents include melamine, urea, guanamine, benzoguanamine, glycoluril, succinylamide and ethyleneurea substituted by methylol groups and/or alkoxymethyl groups for the amino-hydrogen atoms. These nitrogen-containing organic compounds can be prepared by the methylolation reaction of melamine, urea, guanamine, benzoguanamine, glycoluril, succinylamide and ethyleneurea with formaldehyde in boiling water followed by alkoxylation of the methylolated compound with a lower alcohol such as methyl, ethyl, isopropyl and n-propyl alcohols.

Among the above named various nitrogen-containing organic compounds, particularly satisfactory results can be obtained in respect of the good reactivity in the crosslinking reaction by using a melamine compound represented by the general formula

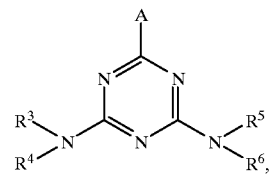

(I)

in which A is a hydrogen atom, alkyl group, aralkyl group, aryl group or substituted or unsubstituted amino group of the formula —$NR^1R^2$ and $R^1$, $R^2$, $R^3$, $R^4$, $R^5$ and $R^6$ are each a hydrogen atom, methylol group or alkoxymethyl group with the proviso that at least two of the four to six groups in a molecule denoted by $R^1$ to $R^6$ are each a methylol group or alkoxymethyl group. Preferably, the melamine compound should have at least 3 but less than 6 methylol and/or alkoxymethyl groups per melamine ring. Several commercial products of such a melamine compound are available on the market and can be used as such including those sold under the trade names of Mx-750 having 3.7 on an average of methoxymethyl groups per melamine ring and Mw-30 having 5.8 on an average of methoxymethyl groups per melamine ring (each a product by Sanwa Chemical Co.) as the melamine compound and Cymel Series products (each a product by Mitsui Cyanamide Co.) as the benzoguanamine compound. These compounds can be used in the form of a dimer or trimer. The above described nitrogen-containing crosslinking compounds can be used either singly or as a combination of two kinds or more.

The binder resin used in the invention can be selected from polyamidoacid resins, polysulfone resins, halogenated polymers, polyacetal resins, acetal copolymers, α-substituted vinyl polymers, polyamine acids, polybutene-sulfonic acids and acrylic resins, though not particularly limitative thereto, of which acrylic resins having an acrylate unit in the molecule are particularly preferable including polymers of glycidyl (meth)acrylate, alkyl (meth)acrylates such as methyl (meth)acrylate, ethyl (meth)acrylate and propyl (meth)acrylate, and poly[4-(4-hydroxyphenyl)sulfonylphenyl (meth)acrylate] as well as copolymers of glycidyl (meth)acrylate and methyl (meth)acrylate. In particular, more preferable binder resins include copolymers of glycidyl methacrylate and methyl methacrylate in a copolymerization ratio of 2:8 to 8:2 or, most preferably, 3:7 to 7:3 by weight and poly[4-(4-hydroxyphenyl)sulfonylphenyl methacrylate] because these resins are little responsible for the occurrence of an intermixing layer between the anti-reflection film and the photoresist layer formed thereon.

It is optional that the binder resin is a composite resin obtained by bonding a highly light-absorbing resin to the above described resin through a crosslinking agent such as a glycidylated polymethyl methacrylate to which a benzophenone compound, diphenylsulfone compound, diphenylsulfoxide compound, naphthalene compound or anthracene compound is bonded.

It is of course optional according to need that the composition for the formation of the anti-reflection coating film comprising the highly light-absorbing compound, crosslinking agent and binder resin is further admixed with a variety of known additives having miscibility including organic acids such as acetic acid, oxalic acid, maleic acid, 2-hydroxybenzoic acid, 3,5-dinitrobenzoic acid and 2,6-dihydroxybenzoic acid as well as an acidic copolymer of 2-hydroxybenzoic acid and p-xylene sold under a trade name of SAX (a product by Mitsui Toatsu Kagaku Co.).

The anti-reflection coating film can be formed by coating the substrate surface with a coating solution prepared by dissolving the above described highly light-absorbing compound, crosslinking agent and binder resin together with the optional ingredients on a suitable organic solvent followed by drying of the coating film. Examples of suitable organic solvents include ketones such as acetone, methyl ethyl ketone, cyclopentanone, cyclohexanone, methyl isoamyl ketone, 2-heptanone and 1,1,1-trimethylacetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof, cyclic ethers such as dioxanes, and esters such as ethyl lactate, methyl acetate, ethyl acetate, butyl acetate, methyl pyruvate, ethyl pyruvate, methyl 3-methoxypropionate and ethyl 3-ethoxypropionate. These organic solvents can be used either singly or as a mixture of two kinds or more.

The coating solution for the formation of the anti-reflection coating film can be admixed, if necessary, with a surface active agent including those sold under the trade names of Surflons SC-103 and SR-100 (each a product by Asahi Glass Co.), EF-351 (a product by Tohoku Hiryo Co.), Florads Fc-431, Fc-135, Fc-98, Fc-430 and Fc-176 (each a product by Sumitomo 3M Co.) as a fluorine-containing surface active agent. The amount of the additive surface active agent, when added, should not exceed 2000 ppm by weight based on the non-volatile matters in the coating solution.

In a preferable formulation of the coating solution for the anti-reflection coating film comprising the highly light-absorbing compound, e.g., ultraviolet-absorbing compound, crosslinking agent and binder resin, the amount of the crosslinking agent is in the range from 10 to 300 parts by weight or, more preferably, from 20 to 200 parts by weight per 100 parts by weight of the highly light-absorbing compound and the amount of the binder resin is in the range from 1 to 400 parts by weight or, more preferably, from 5 to 300 parts by weight per 100 parts by weight of the total amount of the highly light-absorbing compound and the crosslinking agent. When the crosslinking agent is omitted in the formulation, the amount of the highly light-absorbing compound should be in the range from 1 to 200 parts by weight or, preferably, from 5 to 150 parts by weight per 100 parts by weight of the binder resin. These limitations in the formulation of the coating solution are important in order for the coating film to exhibit a high effect of anti-reflection.

It is optional in the present invention that the coating solution for the formation of the anti-reflection coating film is admixed with an inorganic or organic acid having a sulfur-containing acid residue in the molecule. Examples of such an inorganic acid include sulfuric acid, sulfurous acid and thiosulfuric acid, of which sulfuric acid is preferred. Examples of such an organic acid include organic sulfonic acids, organic sulfuric acid esters and organic sulfurous acid esters, of which particularly preferred are organic sulfonic acids such as a compound represented by the general formula

$$R^7-X, \qquad (II)$$

In which $R^7$ is an unsubstituted or substituted monovalent hydrocarbon group and X is a sulfonic acid group.

In the above given general formula (II), the hydrocarbon group denoted by $R^7$, which can be saturated or unsaturated, having a straightly linear, branched or cyclic structure, preferably has 1 to 20 carbon atoms. When $R^7$ is a substituted hydrocarbon group, the substituent can be selected from halogen atoms, e.g., fluorine atom, sulfonic acid group, carboxyl group, hydroxyl group, amino group and cyano group. The number of the substituent groups in a single $R^7$ group is not limited to one.

The group denoted by $R^7$ in the general formula (II) can be an aromatic hydrocarbon group such as phenyl, naphthyl and anthryl groups, of which phenyl group is particularly preferable. These aromatic hydrocarbon groups can be substituted on the aromatic ring by one or more of alkyl groups having 1 to 20 carbon atoms.

Examples of particularly preferable organic sulfonic acids include nonafluorobutane sulfonic acid, methane sulfonic acid and dodecylbenzene sulfonic acid in respect of the good improving effect on the cross sectional profile of the patterned resist layer in the lower portion.

The organic and inorganic acids mentioned above can be used either singly or as a combination of two kinds or more according to need.

The amount of the above mentioned inorganic and/or organic acids, when added, in the coating solution is usually in the range from 0.1 to 10 parts by weight or, preferably, from 1 to 8 parts by weight per 100 parts by weight of the crosslinking agent.

The anti-reflection coating film in the present invention can be formed on the surface of a substrate such as semiconductor silicon wafers by uniformly applying the above described coating solution onto the substrate surface by a known coating method such as spin coating followed by drying of the coating layer and the dried coating layer is then subjected to a heat treatment at a temperature of 150 to 300° C. to effect curing.

In the next place, the thus formed anti-reflection coating film is overcoated with a layer of a photoresist composition which comprises (A) a resinous compound which is an alkali-soluble resin having phenolic hydroxyl groups or the resin rendered alkali-insoluble by substituting substituent groups inert to an acid for a part of the hydroxyl groups, (B) an acid-generating agent and (C) a crosslinking compound.

The above-mentioned alkali-soluble resin having phenolic hydroxyl groups as the component (A) of the photoresist composition is exemplified by various types of novolak resins and hydroxystyrene-based polymers. The novolak resin is prepared from a phenolic compound such as phenol, m-, p- and o-cresols, 2,3-, 2,5-, 3,5- and 3,4-xylenols, 2,3,5-trimethylphenol and 2,3,5-triethylphenol and an aldehyde compound such as formaldehyde, paraformaldehyde and trioxane by conducting a condensation reaction in the presence of an acidic catalyst according to a known procedure. The novolak resin should preferably have a weight-average molecular weight in the range from 2000 to 30000 because, when the weight-average molecular weight is too small, a decrease is caused in the film thickness retention with a poor cross sectional profile of the patterned resist layer while, when too large, an adverse influence is caused on the pattern resolution.

The hydroxystyrene-based polymers as the other class of the resinous component (A) include homopolymers of a hydroxystyrene, copolymers of a hydroxystyrene with another styrene monomer and copolymers of a hydroxystyrene with an acrylic monomer such as (meth)acrylic acid and esters thereof. The above mentioned styrene monomer other than hydroxystyrenes includes styrene, 2- and 4-methylstyrenes, α-methylstyrene, 4-methoxystyrene and 4-chlorostyrene which can be used either singly or as a combination. Examples of the acrylic monomer include methyl (meth)acrylate, ethyl (meth)acrylate, 2-hydroxyethyl (meth)acrylate, 2-hydroxypropyl (meth)acrylate, (meth) acrylamide and (meth)acrylonitrile which can be used either singly or as a combination. The hydroxystyrene-based (co) polymeric resins should have a weight-average molecular weight in the range from 1000 to 30000 for the same reasons as in the novolak resins.

The above described novolak resins and hydroxystyrene-based polymeric resins can be rendered alkali-insoluble by substituting acid-insusceptible substituent groups for a part of the hydroxyl groups. The above mentioned acid-insusceptible substituent group is exemplified by substituted or unsubstituted benzenesulfonyl groups, substituted or unsubstituted naphthalenesulfonyl groups, substituted or unsubstituted benzenecarbonyl groups and substituted or unsubstituted naphthalenecarbonyl groups. Examples of the substituted or unsubstituted benzenesulfonyl group include benzenesulfonyl, chlorobenzenesulfonyl, methylbenzenesulfonyl, ethylbenzenesulfonyl, propylbenzenesulfonyl, methoxybenzenesulfonyl, ethoxybenzenesulfonyl, propoxybenzenesulfonyl and acetoaminobenzenesulfonyl groups. Examples of the substituted or unsubstituted naphthalenesulfonyl group include naphthalenesulfonyl, chloronaphthalenesulfonyl, methylnaphthalenesulfonyl, ethylnaphthalenesulfonyl, propylnaphthalenesulfonyl, methoxynaphthalenesulfonyl, ethoxynaphthalenesulfonyl, propoxynaphthalenesulfonyl and acetoaminonaphthalenesulfonyl groups. Examples of the substituted or unsubstituted benzenecarbonyl and naphthalenecarbonyl groups are given by those groups obtained by replacing the sulfonyl groups in the above named benzenesulfonyl and naphthalenesulfonyl groups with carbonyl groups.

The degree of substitution of the acid-insusceptible groups for the hydroxyl groups in the alkali-soluble resin is in the range from 0.01 to 1% or, preferably, from 0.08 to 0.15%.

Among the phenolic hydroxyl-containing alkali-soluble resins described above as the component (A), hydroxystyrene-based polymeric resins are preferable and homopolymeric polyhydroxystyrene resins and copolymeric resins of 4-hydroxystyrene and styrene are more preferable. Examples of preferable alkali-insolubilized resins by substitution of acid-insusceptible substituent groups for a part of the hydroxyl groups include a polyhydroxystyrene resin of which a part of the hydroxyl groups are substituted by acetoaminobenzenesulfonyl groups although any of the above defined resins can be used either singly or as a combination of two kinds or more.

The acid-generating agent as the component (B) is not particularly limitative and any of the radiation-sensitive acid-generating compounds conventionally used in chemical-amplification photoresist compositions can be used here.

The crosslinkable compound as the component (C) is also not particularly limitative and any of the crosslinkable compounds conventionally used in negative-working chemical-amplification photoresist compositions can be used here. Examples of suitable crosslinkable compounds include amino resins having hydroxyl and/or alkoxy groups in the molecule such as melamine resins, urea resins, guanamine resins, glycoluril/formaldehyde resins, succinylamide/formaldehyde resins and ethyleneurea/formaldehyde resins substituted by hydroxyl and/or alkoxy groups. These substituted amino resins can be prepared by methylolation of melamine, urea, guanamine, glycoluril, succinylamide, ethyleneurea and the like with formaldehyde in boiling water followed by an alkoxylation reaction with a lower alcohol. Several commercial grades of such resin products are available on the market and can be used as such including those sold under the trade names of Nikalacs Mx-750, Mx-290 and Mx-30 (each a product by Sanwa Chemical Co.).

In addition, the crosslinkable compounds usable here as the component (C) include benzene compounds having alkoxy groups such as 1,3,5-tris(methoxymethoxy)benzene, 1,2,4-tris(isopropoxymethoxy)benzene and 1,4-bis(sec-butoxymethoxy)benzene and phenol compounds having hydroxyl and/or alkoxy groups such as 2,6-dihydroxymethyl-p-cresol and 2,6-dihydroxymethyl-4-tert-butyl phenol. The above named crosslinkable compounds can be used either singly or as a combination of two kinds or more.

As to the compounding proportion of the respective components in the photoresist composition for the formation of the negative-working photoresist layer, the weight ratio of the resin as the component (A) and the crosslinkable compound as the component (C) is in the range from 100:3 to 100:70 or, preferably, from 100:5 to 100:50 in respect of the balance of the photosensitivity, uniformity of the resist layer and developability. When the amount of the crosslinkable compound is too small, the photosensitivity of the photoresist composition cannot be high enough while, when the amount is too large, a patterned resist layer of high quality can hardly be obtained due to decrease in the developability of the photoresist layer.

The amount of the acid-generating agent as the component (B) is in the range from 0.1 to 30% by weight or, preferably, from 1 to 20% by weight based on the total amount of the components (A) and (C). When the amount of the component (B) is outside of this range, the developability of the photoresist layer is decreased and patterning of the resist layer can hardly be accomplished.

A typical procedure for the formation of a photoresist layer on the anti-reflection coating film is as follows. Thus, a negative-working photoresist composition in the form of a solution is prepared by dissolving the above described components (A), (B) and (C) in an organic solvent and this photoresist solution is uniformly applied to the surface of the anti-reflection coating film by using a conventional coating means such as spinners, doctor blades and the like followed by drying to form a dried photoresist layer.

Examples of the organic solvents used in the preparation of the photoresist solution include ketones such as acetone, methyl ethyl ketone, cyclopentanone, cyclohexanone, methyl isoamyl ketone, 2-heptanone and 1,1,1-trimethyl acetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof, cyclic ethers such as dioxane, and esters such as ethyl lactate, methyl acetate, ethyl acetate, butyl acetate, methyl pyruvate, ethyl pyruvate, methyl 3-methoxypropionate and ethyl 3-ethoxypropionate. These organic solvents can be used either singly or as a mixture of two kinds or more.

It is of course optional according to need that the photoresist solution is admixed with a variety of additives having compatibility including auxiliary resins to improve or modify the properties of the photoresist layer as a film, plasticizers, stabilizers, coloring agents and surface active agents each in a limited amount.

In the method of the present invention, it is essential that the anti-reflection coating film formed on the surface of a substrate has specified values of the refractive index (n) and the light-absorption coefficient (k) controlled in such a way that, in a graph prepared by plotting with the thickness of the anti-reflection coating film x as the abscissa and the reflectivity of the exposure light at the interface between the anti-reflection coating film and the photoresist layer y as the ordinate, the range of the film thickness x corresponding to an increment of 0.01 in the reflectivity y in both sides of the minimum point of the x-y curve does not exceed ±0.01 $\mu$m.

Control of the refractive index and light-absorption coefficient of the anti-reflection coating film can be accomplished by adequately selecting the kinds and compounding proportion of the highly light-absorbing compound, e.g., ultraviolet absorber, crosslinking agent and/or binder resin in the anti-reflection coating film. When an anthracene compound is used as the highly light-absorbing compound, for example, the light-absorption coefficient of the film can be increased as compared with bisphenolsulfone compounds. Further, the light absorption coefficient and refractive index of the film can be increased as a trend when an acidic ingredient is contained therein as compared with absence of such an acidic ingredient.

When the content of the highly light-absorbing compound is increased in the anti-reflection coating film, on the other hand, the light-absorption coefficient of the film is increased as a trend. While the refractive index of the film is increased by increasing the content of an anthracene compound used as the highly light-absorbing compound, the refractive index is rather decreased by increasing the content of the highly light-absorbing compound when a bisphenolsulfone compound is used therefor.

Figure 2:
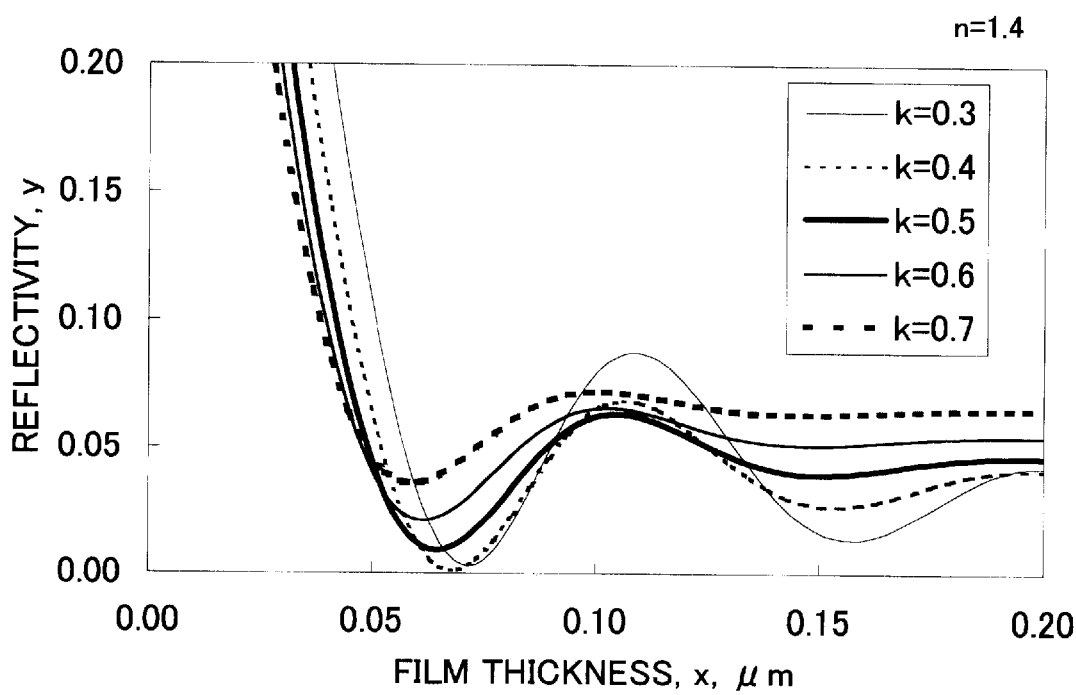
FIG. 2 is a graph showing the thickness-reflectivity curves for n=1.4 with varied k values as the parameter.
Figure 3:
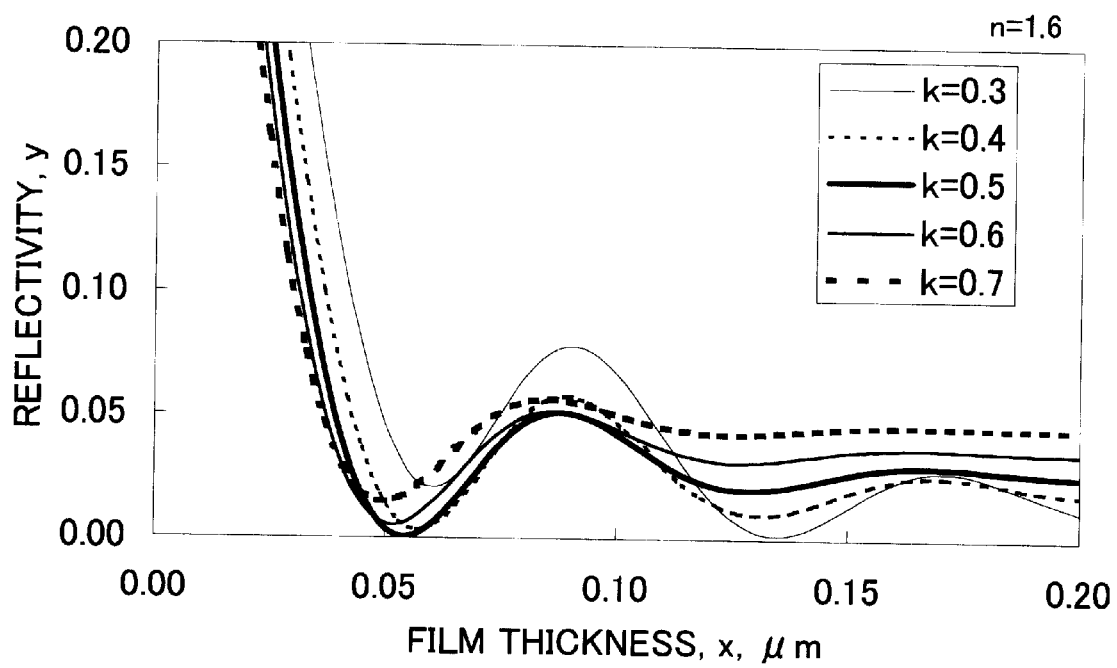
FIG. 3 is a graph showing the thickness-reflectivity curves for n=1.6 with varied k values as the parameter.
Figure 4:
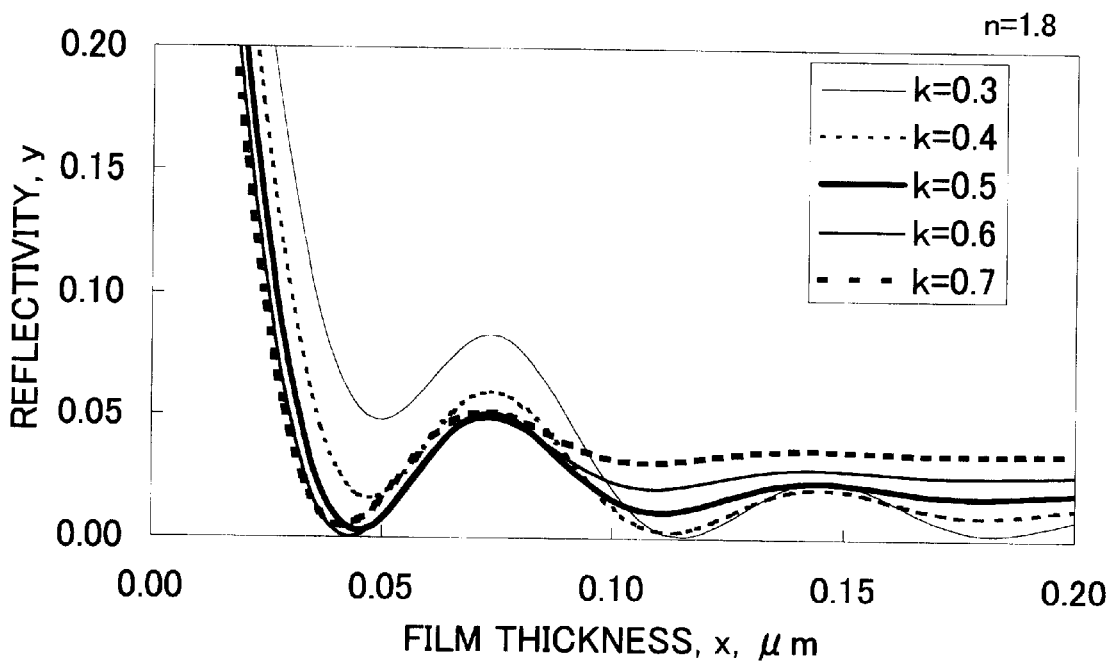
FIG. 4 is a graph showing the thickness-reflectivity curves for n=1.8 with varied k values as the parameter.
Figure 5:
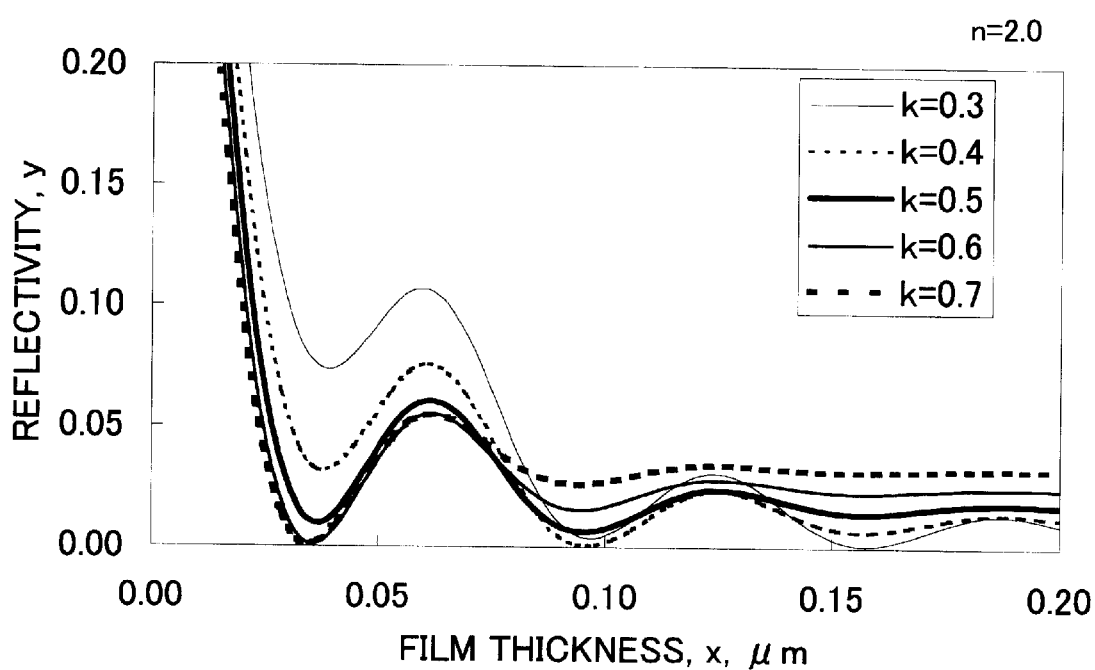
FIG. 5 is a graph showing the thickness-reflectivity curves for n=2.0 with varied k values as the parameter.
Figure 6:
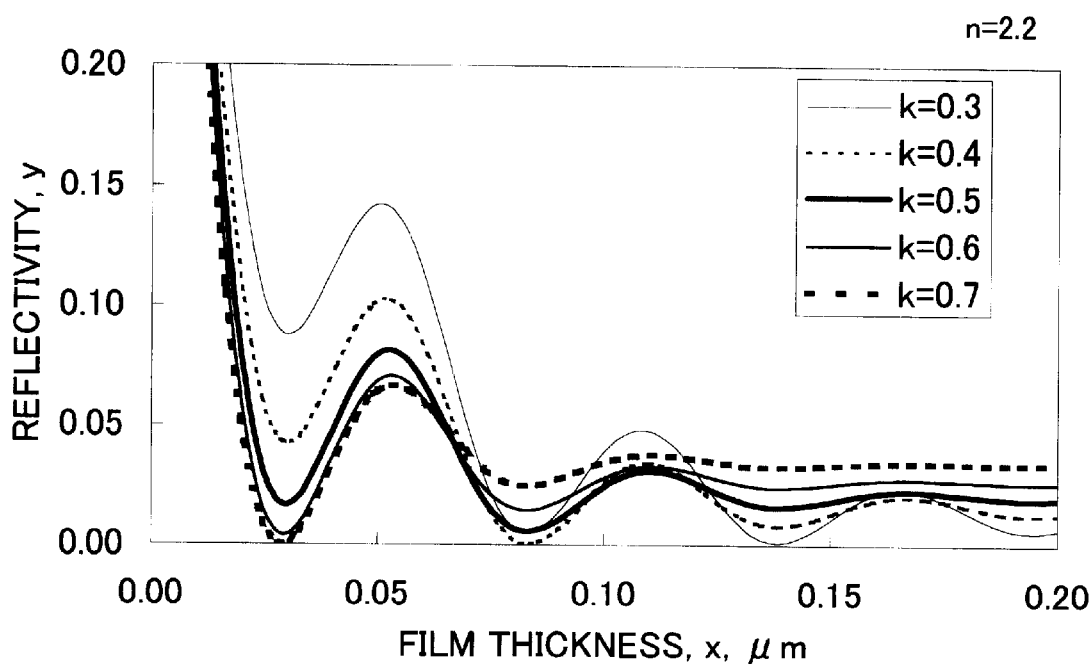
FIG. 6 is a graph showing the thickness-reflectivity curves for n=2.2 with varied k values as the parameter.

FIG. 2 of the accompanying drawing is a graph showing the interface reflectivity y as a function of the thickness x of the anti-reflection coating film for a refractive index n of 1.4 and for five different values 0.3, 0.4, 0.5, 0.6 and 0.7 of the light absorption coefficient k as a variable parameter. Two minimum points of y are found in each of these five x-y curves in the vicinities of x=0.06–0.07 $\mu$m and x=0.15 $\mu$m. FIGS. 3, 4, 5 and 6 are each a graph similar to FIG. 2 for different values 1.6, 1.8, 2.0 and 2.2, respectively, of the refractive index n.

It is a trend shown in these graphs that the minimum point of the reflectivity y shifts leftwardly or, namely, toward the direction of smaller values in the film thickness x as the refractive index n of the anti-reflection coating film is increased. Within the range of the light-absorption coefficient of 0.3 to 0.7, in other words, the thickness x of the anti-reflection coating film can be decreased within a certain range by selecting a material having a larger refractive index n for the film. Accordingly, the present invention provides a means for decreasing the thickness of the anti-reflection coating film without adversely affecting the performance thereof by selecting the composition of the film so as to have an increased refractive index.

Following are several particular formulations of the anti-reflection coating film by which specified values of the refractive index n and the light-absorption coefficient k can be obtained.

(1) Values of n=1.60 to 1.65 and k=0.5 to 0.6 can be obtained from a composition consisting of:
    0.83 g of an ester compound between a polymethacrylic acid and 4,4'-dihydroxyphenylsulfone;
    0.83 g of anthracene methanol;
    0.83 g of benzoguanamine (Cymel 1125); and
    97.5 g of propyleneglycol monomethyl ether.
(2) Values of n=1.80 and k=0,4 can be obtained from a composition consisting of:
    2.5 g of 4,4'-dihydroxyphenylsulfone;
    2.5 g of benzoguanamine (Cymel 1125); and
    95.0 g of propyleneglycol monomethyl ether.
(3) Values of n=1.45 and k=0.4 can be obtained from a composition consisting of:
    1.0 g of benzoguanamine (Cymel 1125);
    1.0 g of anthracene carboxylic acid;
    1.0 g of a copolymer of glycidyl methacrylate and methyl methacrylate; and
    97.0 g of propyleneglycol monomethyl ether.

Patterning of the thus prepared multilayered photoresist material, of which the anti-reflection coating film has a decreased thickness, can be performed by utilizing the conventional photolithographic technology. Thus, the negative-working photoresist layer is exposed patternwise to deep ultraviolet light or excimer laser beams through a pattern-bearing photomask, for example, on a minifying projection exposure machine followed by a post-exposure baking treatment and a development treatment with an aqueous alkaline developer solution such as a 1–10% by weight aqueous solution of tetramethylammonium hydroxide to form a negatively patterned resist layer on the underlying anti-reflection coating film. Thereafter, the anti-reflection coating film in the exposed areas is removed by etching in a plasma atmosphere with the patterned resist layer as the masking to complete a finely patterned negative-working resist layer having high fidelity to the photomask pattern.

In the following, the present invention is described in more detail by way of Examples, which, however, never limit the scope of the invention in any way.

EXAMPLE 1

An anti-reflection coating composition in the form of a solution was prepared by dissolving, in 97.5 g of propyleneglycol monomethyl ether, 0.83 g of an ester compound of a polymethacrylic acid and 4,4'-dihydroxyphenyl sulfone, 0.83 g of anthracene methanol and 0.83 g of benzoguanamine (Cymel 1125, supra). A substrate was spin-coated with the coating solution followed by a heat treatment at 180° C. for 90 seconds to form an anti-reflection film having a thickness of 0.05 μm. Thereafter, a photoresist layer was formed on the anti-reflection film by coating with a positive-working chemical-amplification photoresist composition (TDUR-DP018, a product by Tokyo Ohka Kogyo Co.). The values of the refractive index n and the absorption coefficient k in this case were 1.63 and 0.55, respectively, to give coincidence between the actual film thickness and the calculated film thickness of 0.05 μm corresponding to a variation of ±0.01 μm to cause a variation of the reflectivity in the vicinity of the minimum point.

The photoresist layer was patternwise exposed to light through a patterned photomask on a minifying projection exposure machine (Model Nikon NSR-2005EX8A, manufactured by Nikon Co.) followed by a post-exposure baking treatment on a hot plate at 130° C. for 90 seconds and then subjected to a development treatment with a 2.38% by weight aqueous solution of tetramethylammonium hydroxide followed by rinse with water and drying to accomplish patterning of the photoresist layer.

The thus patterned resist layer was examined with a scanning electron microscope for the cross sectional profile which was excellently orthogonal in the 0.18 μm line pattern absolutely without deformation on the side walls by the influence of standing waves.

EXAMPLE 2

An anti-reflection coating composition in the form of a solution was prepared by dissolving, in 95.0 g of propyleneglycol monomethyl ether, 2.5 g of 4,4'-dihydroxyphenyl sulfone and 2.5 g of benzoguanamine (Cymel 1125, supra). A substrate was spin-coated with the coating solution followed by a heat treatment at 180° C. for 90 seconds to form an anti-reflection film having a thickness of 0.045 μm. Thereafter, a photoresist layer was formed on the anti-reflection film by coating with a positive-working chemical-amplification photoresist composition (TDUR-DP018, supra). The values of the refractive index n and the absorption coefficient k in this case were 1.8 and 0.40, respectively, to give a minimum point at 0.045 μm corresponding to a variation of ±0.01 μm.

The photoresist layer was patternwise exposed to light through a patterned photomask on a minifying projection exposure machine (Model Nikon NSR-2005EX8A, supra) followed by a post-exposure baking treatment on a hot plate at 130° C. for 90 seconds and then subjected to a development treatment with a 2.38% by weight aqueous solution of tetramethylammonium hydroxide followed by rinse with water and drying to accomplish patterning of the photoresist layer.

The thus patterned resist layer was examined with a scanning electron microscope for the cross sectional profile which was excellently orthogonal in the 0.18 μm line pattern absolutely without deformation on the side walls by the influence of standing waves.

EXAMPLE 3

An anti-reflection coating composition in the form of a solution was prepared by dissolving, in 97.0 g of propyleneglycol monomethyl ether, 1.0 g of benzoguanamine (Cymel 1125, supra), 1.0 g of anthracene carboxylic acid and 1.0 g of a copolymer of glycidyl methacrylate and methyl methacrylate. A substrate was spin-coated with the coating solution followed by a heat treatment at 180° C. for 90 seconds to form an anti-reflection film having a thickness of 0.07 μm. Thereafter, a photoresist layer was formed on the anti-reflection film by coating with a positive-working chemical-amplification photoresist composition (TDUR-DP018, supra). The values of the refractive index n and the absorption coefficient k in this case were 1.45 and 0.40, respectively, to give coincidence between the actual film thickness and the calculated film thickness of 0.07 μm corresponding to a variation of ±0.01 μm to cause a variation of the reflectivity in the vicinity of the minimum point.

The photoresist layer was patterned in the same manner as in Example 1 and examined with a scanning electron microscope for the cross sectional profile which was excellently orthogonal in the 0.18 μm line pattern absolutely without deformation on the side walls by the influence of standing waves.

EXAMPLE 4

An anti-reflection coating composition in the form of a solution was prepared by dissolving, in 67 g of propyleneglycol monomethyl ether, 1.0 g of melamine (Mx-750, supra) and 0.5 g of anthracene carboxylic acid. A substrate was spin-coated with the coating solution followed by a heat treatment at 180° C. for 90 seconds to form an anti-reflection film having a thickness of 0.045 μm. Thereafter, a photoresist layer was formed on the anti-reflection film by coating with a positive-working chemical-amplification photoresist composition (TDUR-P308, supra). The values of the refractive index n and the absorption coefficient k in this case were 1.80 and 0.60, respectively, to give coincidence between the actual film thickness and the calculated film thickness of 0.045 μm corresponding to a variation of ±0.01 μm to cause a variation of the reflectivity in the vicinity of the minimum point.

The photoresist layer was patterned in the same manner as in Example 1 and examined with a scanning electron microscope for the cross sectional profile which was excellently orthogonal in the 0.15 μm line pattern absolutely without deformation on the side walls by the influence of standing waves.

EXAMPLE 5

An anti-reflection coating composition in the form of a solution was prepared by dissolving, in 60 g of propyleneglycol monomethyl ether, 1.0 g of a polyglycidyl methacrylate having a weight-average molecular weight of 10000 and 0.5 g of 9-anthracene carboxylic acid. A substrate was spin-coated with the coating solution followed by a heat treatment at 180° C. for 90 seconds to form an anti-reflection film having a thickness of 0.06 μm. Thereafter, a photoresist layer was formed on the anti-reflection film by coating with a positive-working chemical-amplification photoresist composition (TDUR-P308, supra). The values of the refractive index n and the absorption coefficient k in this case were 1.40 and 0.40, respectively, to give coincidence between the actual film thickness and the calculated film thickness of 0.060 μm corresponding to a variation of ±0.01 μm to cause a variation of the reflectivity in the vicinity of the minimum point.

The photoresist layer was patterned in the same manner as in Example 1 and examined with a scanning electron microscope for the cross sectional profile which was excellently orthogonal in the 0.15 μm line pattern absolutely without deformation on the side walls by the influence of standing waves.

Comparative Example

A coating solution for an anti-reflection film was prepared by dissolving, in 96.5 g of propyleneglycol monoethyl ether, 1.75 g of 4,4'-dihydroxyphenyl sulfone and 1.75 g of benzoguanamine (Cymel 1125, supra). A substrate was spin-coated with this coating solution followed by a heat treatment at 180° C. for 90 seconds to form an anti-reflection film having a thickness of 0.05 μm. A positive-working chemical-amplification photoresist layer was formed on the anti-reflection film and patterned in the same manner as in Example 1. The values of the refractive index n and the absorption coefficient of this anti-reflection film were 1.80 and 0.40, respectively, and the minimum point within a variation of ±0.01 μm was 0.11.

The results of the examination of the thus patterned resist layer with a scanning electron microscope for the cross sectional profile were that deformation was found on the side walls of the patterned resist layer by the influence of standing waves and the cross sectional profile was poor in orthogonality.

What is claimed is:

1. In a method for the formation of a patterned photoresist layer on the surface of a substrate with intervention of an anti-reflection film by a photolithographic patterning process comprising the steps of forming an anti-reflection coating film containing a resinous ingredient, a light-absorbing compound and a thermally crosslinkable compound on the substrate surface, forming a photoresist layer on the anti-reflection coating film, patternwise exposing the photoresist layer to a light and subjecting the patternwise exposed photoresist layer to a development treatment, the improvement which comprises controlling the refractive index and the light-absorption coefficient of the anti-reflection coating film in such a way that, in a graph prepared by plotting the thickness of the anti-reflection coating film taken as the abscissa values and the reflectivity of the light for patterning exposure at the interface between the anti-reflection coating film and the photoresist layer thereon taken as the ordinate values, the range of the variation in the film thickness corresponding to an increment of 0.01 in the reflectivity at both sides of the minimum point on the thickness vs. reflectivity curve does not exceed ±0.01 μm.

2. The improvement as claimed in claim 1 in which the reflectivity at the minimum point on the thickness vs. reflectivity curve does not exceed 0.01.

3. The improvement as claimed in claim 1 in which the refractive index and light-absorption coefficient of the anti-reflection coating film are controlled by selecting the kinds and contents of the resinous ingredient contained therein.

4. The improvement as claimed in claim 1 in which the refractive index and light-absorption coefficient of the anti-reflection coating film are controlled by selecting the kinds and contents of the light-absorbing compound contained therein.

5. The improvement as claimed in claim 1 in which the refractive index and light-absorption coefficient of the anti-reflection coating film are controlled by selecting the kinds and contents of the thermally crosslinkable compound contained therein.

* * * * *